US009224794B2

(12) United States Patent
Keating et al.

(10) Patent No.: US 9,224,794 B2
(45) Date of Patent: *Dec. 29, 2015

(54) EMBEDDED MEMORY DEVICE HAVING MIM CAPACITOR FORMED IN EXCAVATED STRUCTURE

(71) Applicant: Intel Corporation, Santa Clara, CA (US)

(72) Inventors: Steven Keating, Beaverton, OR (US); Nick Lindert, Beaverton, OR (US); Nadia Rahhal-Orabi, Hillsboro, OR (US); Brian Doyle, Portland, OR (US); Satyarth Suri, Hillsboro, OR (US); Swaminathan Sivakumar, Beaverton, OR (US); Lana Jong, Hillsboro, OR (US); Lin Sha, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 231 days.

This patent is subject to a terminal disclaimer.

(21) Appl. No.: 13/868,273

(22) Filed: Apr. 23, 2013

(65) Prior Publication Data

US 2013/0234290 A1    Sep. 12, 2013

Related U.S. Application Data

(60) Continuation of application No. 13/028,400, filed on Feb. 16, 2011, now Pat. No. 8,441,057, which is a division of application No. 12/286,338, filed on Sep. 30, 2008, now Pat. No. 7,927,959.

(51) Int. Cl.
*H01L 29/92* (2006.01)
*H01L 49/02* (2006.01)
(Continued)

(52) U.S. Cl.
CPC ............... *H01L 28/40* (2013.01); *H01G 4/012* (2013.01); *H01G 4/33* (2013.01); *H01L 23/5223* (2013.01);
(Continued)

(58) Field of Classification Search
USPC ........................................................ 438/751
See application file for complete search history.

(56) References Cited

U.S. PATENT DOCUMENTS 6,436,787 B1   8/2002   Shih et al.
6,670,237 B1   12/2003  Loh et al.
(Continued)

FOREIGN PATENT DOCUMENTS

CN    1599028 A     3/2005
CN    101174585 A   5/2008
(Continued)

OTHER PUBLICATIONS

Office Action received for Chinese Patent Application No. 200980137685.1, mailed on May 30, 2014, 10 pages of English Translation and 5 pages of Chinese Office Action.
(Continued)

*Primary Examiner* — Stephen W Smoot
(74) *Attorney, Agent, or Firm* — Thorpe North & Western LLP

(57) ABSTRACT

A method of patterning a metal (141, 341, 841) on a vertical sidewall (132, 332, 832) of an excavated feature (130, 330, 830) includes placing a material (350) in the excavated feature such that a portion (435) of the metal is exposed in the excavated feature above the material, etching the exposed portion of the metal away from the vertical sidewall using a first wet etch chemistry, and removing the material from the excavated feature by etching it away using a second wet etch chemistry. The described method may be used to produce a MIM capacitor (800) suitable for an eDRAM device.

6 Claims, 5 Drawing Sheets

(51) Int. Cl.

| | | |
|---|---|---|
| *H01G 4/012* | (2006.01) | |
| *H01G 4/33* | (2006.01) | |
| *H01L 23/522* | (2006.01) | |
| *H01L 27/108* | (2006.01) | |

(52) U.S. Cl.
CPC .......... *H01L 27/10852* (2013.01); *H01L 28/90* (2013.01); *H01L 28/91* (2013.01); *H01L 28/92* (2013.01); *H01L 2924/0002* (2013.01)

(56) References Cited

U.S. PATENT DOCUMENTS

| | | | |
|---|---|---|---|
| 7,224,014 | B2 | 5/2007 | Ichimura |
| 7,927,959 | B2 | 4/2011 | Keating et al. |
| 8,441,057 | B2 | 5/2013 | Keating et al. |
| 2003/0013252 | A1 | 1/2003 | Hwang et al. |
| 2004/0152255 | A1 | 8/2004 | Seidl et al. |
| 2005/0009346 | A1 | 1/2005 | Miyajima |
| 2005/0024979 | A1 | 2/2005 | Kim et al. |
| 2005/0106809 | A1 | 5/2005 | Shea |
| 2006/0086952 | A1 | 4/2006 | Kim et al. |
| 2009/0191686 | A1 | 7/2009 | Wang et al. |

FOREIGN PATENT DOCUMENTS

| | | |
|---|---|---|
| JP | 2002-270798 A | 9/2002 |
| JP | 2005-032800 A | 2/2005 |
| JP | 2005-150159 A | 6/2005 |
| KR | 10-2005-0006017 A | 1/2005 |
| KR | 10-2005-0112396 A | 11/2005 |
| KR | 10-2008-0019915 A | 3/2008 |
| WO | 2010/039629 A2 | 4/2010 |
| WO | 2008/087498 A1 | 7/2010 |
| WO | 2010/039629 A3 | 7/2010 |

OTHER PUBLICATIONS

Notice of Grant received for Japanese Patent Application No. 2011-529301, mailed on Aug. 6, 2013, 1 page of Grant only.
Office Action received for European Patent Application No. 09818322.1, mailed on May 12, 2011, 2 Pages.
Office Action received for Korean Patent Application No. 10-2011-7007256, mailed on Jan. 4, 2013, 8 pages of Office Action including 4 pages of English Translation.
Office Action received for Korean Patent Application No. 10-2011-7007256, mailed on Jul. 17, 2012, 9 pages of Office Action including 4 pages of English Translation.
Office Action received for Japan Patent Application No. 2011-529301, mailed on Mar. 5, 2013, 7 pages of Office Action including 4 pages of English Translation.
International Preliminary Report on Patentability received for PCT Patent Application PCT/US2009/058540, Apr. 14, 2011, 8 Pages.
International Search Report and Written Opinion received for PCT Patent Application PCT/US2009/058540, Apr. 23, 2010, 11 Pages.
Office Action Received for Chinese Patent Application No. 200980137685.1, mailed on Mar. 15, 2013, 7 Pages of Chinese Office Action and 13 Pages of English Translation.
Office Action Received for European Patent Application No. 09818322.1-1, mailed on May 2, 2013, 8 Pages of European Office Action.
Office Action received for Chinese Patent Application No. 200980137685.1, mailed on Nov. 18, 2013, 16 Pages of Office Action including 11 Pages of English Translation.
European Search Report received for European Patent Application No. 09818322.1 mailed on Apr. 15, 2013, 3 pages of Search Report.
Chinese patent application 200980137685.1; filed Sep. 28, 2009; Intel Corporation; office action Feb. 5, 2015.

US 9,224,794 B2

EMBEDDED MEMORY DEVICE HAVING MIM CAPACITOR FORMED IN EXCAVATED STRUCTURE

CLAIM OF PRIORITY

This application is a continuation of U.S. patent application Ser. No. 13/028,400 (now U.S. Pat. No. 8,441,057), filed on Feb. 16, 2011, which is a divisional of U.S. patent application Ser. No. 12/286,338 (now U.S. Pat. No. 7,927,959), filed on Sep. 30, 2008.

FIELD OF THE INVENTION

The disclosed embodiments of the invention relate generally to metal-insulator-metal (MIM) capacitors, and relate more particularly to techniques suitable for manufacturing such capacitors in embedded technologies.

BACKGROUND OF THE INVENTION

Memory access time is a significant factor affecting the performance of computer systems. System performance can typically be enhanced by placing the memory on the same die or in the same package as the processor, and embedded dynamic random access memory (embedded DRAM, or eDRAM) is an example of such on-die or on-package memory technology. Because capacitors are the data storage element of eDRAM, the fabrication of eDRAM involves the manufacture of embedded capacitors—a process that includes subtractive metal patterning.

BRIEF DESCRIPTION OF THE DRAWINGS

The disclosed embodiments will be better understood from a reading of the following detailed description, taken in conjunction with the accompanying figures in the drawings in which.

Figure 1:
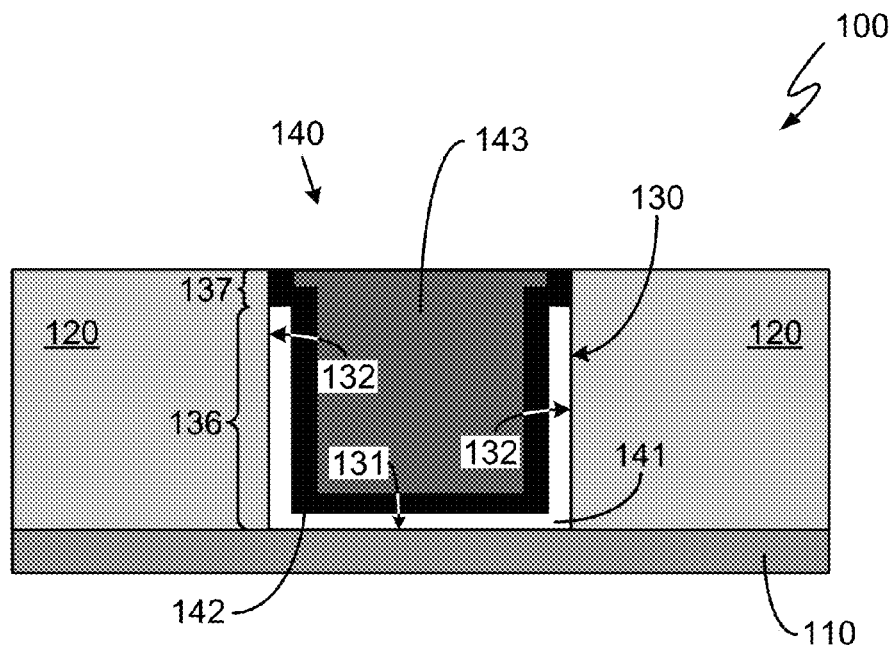
FIG. 1 is a cross-sectional view of an embedded memory device according to an embodiment of the invention.

For simplicity and clarity of illustration, the drawing figures illustrate the general manner of construction, and descriptions and details of well-known features and techniques may be omitted to avoid unnecessarily obscuring the discussion of the described embodiments of the invention. Additionally, elements in the drawing figures are not necessarily drawn to scale. For example, the dimensions of some of the elements in the figures may be exaggerated relative to other elements to help improve understanding of embodiments of the present invention. The same reference numerals in different figures denote the same elements, while similar reference numerals may, but do not necessarily, denote similar elements.

The terms "first," "second," "third," "fourth," and the like in the description and in the claims, if any, are used for distinguishing between similar elements and not necessarily for describing a particular sequential or chronological order. It is to be understood that the terms so used are interchangeable under appropriate circumstances such that the embodiments of the invention described herein are, for example, capable of operation in sequences other than those illustrated or otherwise described herein. Similarly, if a method is described herein as comprising a series of steps, the order of such steps as presented herein is not necessarily the only order in which such steps may be performed, and certain of the stated steps may possibly be omitted and/or certain other steps not described herein may possibly be added to the method. Furthermore, the terms "comprise," "include," "have," and any variations thereof, are intended to cover a non-exclusive inclusion, such that a process, method, article, or apparatus that comprises a list of elements is not necessarily limited to those elements, but may include other elements not expressly listed or inherent to such process, method, article, or apparatus.

The terms "left," "right," "front," "back," "top," "bottom," "over," "under," and the like in the description and in the claims, if any, are used for descriptive purposes and not necessarily for describing permanent relative positions. It is to be understood that the terms so used are interchangeable under appropriate circumstances such that the embodiments of the invention described herein are, for example, capable of operation in other orientations than those illustrated or otherwise described herein. The term "coupled," as used herein, is defined as directly or indirectly connected in an electrical or non-electrical manner. Objects described herein as being "adjacent to" each other may be in physical contact with each other, in close proximity to each other, or in the same general region or area as each other, as appropriate for the context in which the phrase is used. Occurrences of the phrase "in one embodiment" herein do not necessarily all refer to the same embodiment.

DETAILED DESCRIPTION OF THE DRAWINGS

In one embodiment of the invention, a method of patterning a metal on a vertical sidewall of an excavated feature comprises placing a material in the excavated feature such that a portion of the metal is exposed in the excavated feature above the material, etching the exposed portion of the metal away from the vertical sidewall using a first wet etch chemistry, and removing the material from the excavated feature by etching it away using a second wet etch chemistry. The described method may be used to produce a MIM capacitor suitable for an eDRAM device.

It was mentioned above that eDRAM capacitors are manufactured using a subtractive metal patterning process. Traditionally, subtractive metal patterning has been done by plasma etching. Plasma etches are highly anisotropic, making it very difficult to cleanly remove metal from a surface oriented orthogonally to the wafer surface and plasma field. Embodiments of the invention overcome this problem by using appropriate wet etch techniques and chemicals to isotropically etch and precisely pattern the metal on the side wall of an excavated feature such as a trench or a via, thus enabling the efficient manufacture of eDRAM capacitors.

Referring now to the drawings, FIG. 1 is a cross-sectional view of an embedded memory device 100, such as an eDRAM or the like, according to an embodiment of the invention. As illustrated in FIG. 1, embedded memory device 100 comprises an electrically conductive layer 110, an electrically insulating layer 120 over electrically conductive layer 110, an excavated feature 130 in electrically insulating layer 120 that extends to electrically conductive layer 110, and a MIM capacitor 140 in excavated feature 130. MIM capacitor 140 comprises an electrically conductive layer 141 located in excavated feature 130 adjacent to and electrically connected to electrically conductive layer 110, an electrically insulating layer 142 located in excavated feature 130 interior to electrically conductive layer 141, and an electrically conductive layer 143 located in excavated feature 130 interior to electrically insulating layer 142.

Electrically conductive layer 110 acts as a floor 131 of excavated feature 130. Excavated feature 130 further comprises sidewalls 132 extending away from floor 131, as shown. In some embodiments excavated feature 130 may have an aspect ratio of approximately 1:1. In other embodiments excavated feature 130 may have a high aspect ratio (e.g., approximately 2:1 or greater). In these or other embodiments sidewalls 132 may form an angle with floor 131 that has a magnitude between approximately 60 degrees and approximately 100 degrees. Electrically conductive layer 141 covers floor 131 and a portion 136 of sidewalls 132, while electrically insulating layer 142 covers electrically conductive layer 141 and a portion 137 of sidewalls 132. It should be understood that when a layer or other device component is described herein as "covering" another layer or device component, that layer (the covering layer) is located over at least some of the (formerly) exposed surfaces of the covered layer.

As an example, electrically conductive layer 110 can be a metal line made of copper or the like. As another example, electrically conductive layer 143 can be a plug made of copper or another metal. In one embodiment, the metal of electrically conductive layer 110 and the metal of electrically conductive layer 143 are the same (as in the case where both are copper). As another example, electrically insulating layer 142 can be a conformal dielectric film, which in one embodiment comprises a high-k metal oxide or other high-k material. (As used herein, the phrase "high-k" refers to materials having a dielectric constant, k, greater than that of silicon dioxide, that is, greater than about 4.)

Figure 2:
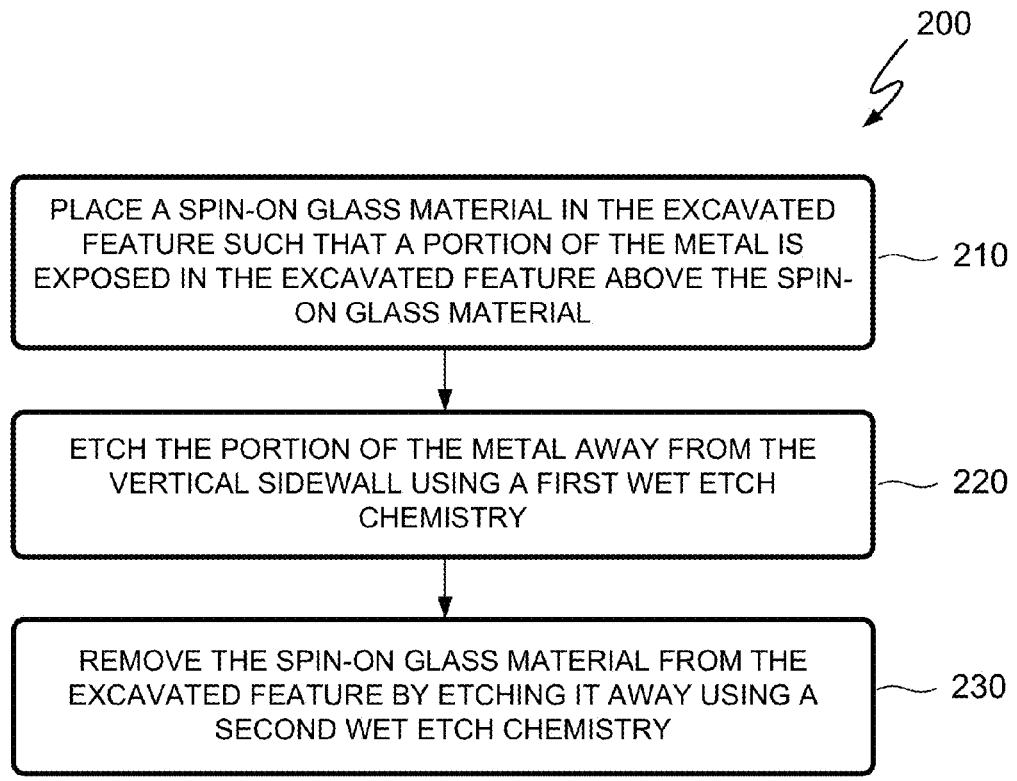
FIG. 2 is a flowchart illustrating a method of patterning a metal on a vertical sidewall of an excavated feature according to an embodiment of the invention.

FIG. 2 is a flowchart illustrating a method 200 of patterning a metal on a vertical sidewall of an excavated feature according to an embodiment of the invention. As an example, method 200 may result in the formation of a structure in which an embedded memory device may be constructed. As another example, the embedded memory device that may be constructed in the structure resulting from the performance of method 200 may be similar to embedded memory device 100 that is shown in FIG. 1.

A step 210 of method 200 is to place a spin-on glass material in the excavated feature such that a portion of the metal is exposed in the excavated feature above the spin-on glass material. As an example, the spin-on glass material can be similar to a spin-on glass material 350 that is first shown in FIG. 3, which is a cross-sectional view of a structure 300 at a particular point in its manufacturing process according to an embodiment of the invention. As mentioned, structure 300 is a structure in which an embedded memory device may be constructed according to embodiments of the invention may be constructed. As a particular example, spin-on glass material 350 can be a polyalkylsiloxane film or the like.

In one embodiment, step 210 comprises depositing the spin-on glass material using a spin-coating technique. Spin coating allows the thickness of the coating to be precisely controlled, which is desirable for many embodiments, and also provides a smooth application that fills any pores in the material being coated.

Figure 3:
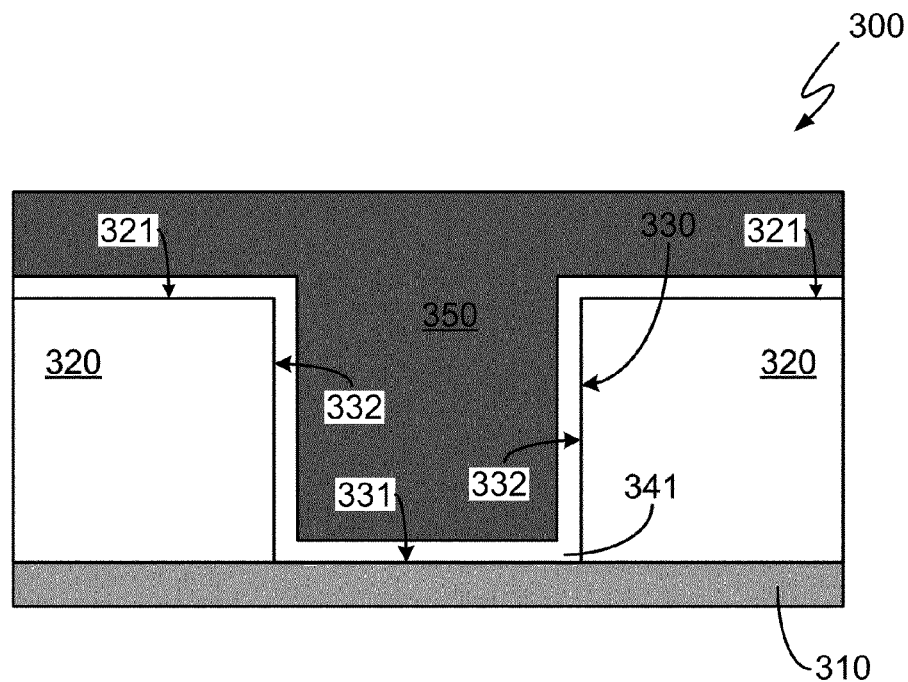
FIGS. 3-6 are cross-sectional views, at various particular points in a manufacturing process, of a structure according to an embodiment of the invention in which an embedded memory device may be constructed.

As illustrated in FIG. 3, structure 300 comprises an electrically conductive layer 310, an electrically insulating layer 320 over electrically conductive layer 310, and an excavated feature 330 in electrically insulating layer 320 that extends to electrically conductive layer 310. Electrically conductive layer 310 acts as a floor 331 of excavated feature 330. Excavated feature 330 further comprises sidewalls 332 extending away from floor 331, as shown. A metal layer 341 lines excavated feature 330 and covers a surface 321 of electrically insulating layer 320. In one embodiment, metal layer 341 is deposited using chemical vapor deposition (CVD) or the like. As an example, electrically conductive layer 310, electrically insulating layer 320, excavated feature 330, floor 331, sidewalls 332, and metal layer 341 can be similar to, respectively, electrically conductive layer 110, electrically insulating layer 120, excavated feature 130, floor 131, sidewalls 132, and electrically conductive layer 141, all of which are shown in FIG. 1.

Figure 4:
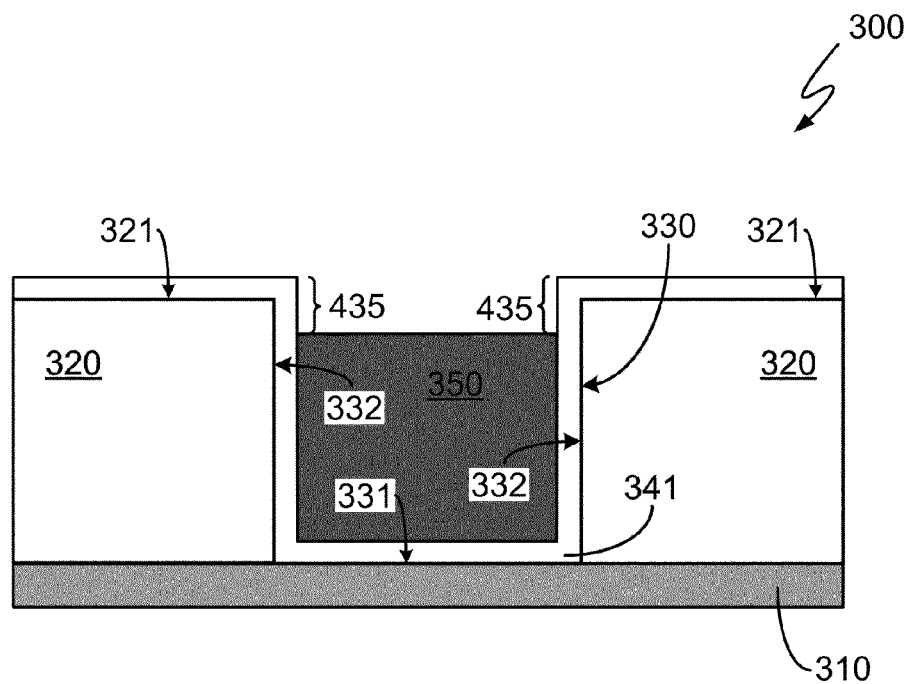

FIG. 4 is a cross-sectional view of structure 300 at a different particular point in its manufacturing process according to an embodiment of the invention. As illustrated in FIG. 4, a portion of spin-on glass material 350 has been removed from excavated feature 330 such that the remaining spin-on glass material is recessed in excavated feature 330 and such that surface 321 and a portion 435 of metal layer 341 are exposed. Recall that step 210 of method 200 resulted in the exposure of a metal within an excavated feature; portion 435 is that exposed metal. In one embodiment, the portion of the spin-on glass material that is removed is etched away using a plasma etch or the like.

FIGS. 3 and 4 depict an embodiment in which step 210 comprises filling a metal-lined excavated feature with spin-on glass material and then removing a portion of the spin-on glass material such that a portion of the metal is exposed. Other embodiments may follow a different path to arrive at a structure having the same makeup (i.e., an excavated feature in which spin-on glass material is placed so as to expose a portion of a metal layer above the spin-on glass material). As an example, the spin-on glass material could be deposited such that it only partly fills the excavated feature, thus leaving a portion of the metal layer exposed above it.

A step 220 of method 200 is to etch the portion (i.e., the exposed portion) of the metal away from the vertical sidewall using a first wet etch chemistry. In one embodiment, the first wet etch chemistry comprises an oxidizing or acid-based aqueous chemistry. Appropriate chemistries will be capable of removing portion 435 of metal layer 341 without damaging electrically insulating layer 320 or spin-on glass material 350 or penetrating along or undercutting the interface between spin-on glass material 350 and metal layer 341. Accordingly, the spin-on glass material acts as a mask for the wet etching.

Figure 5:
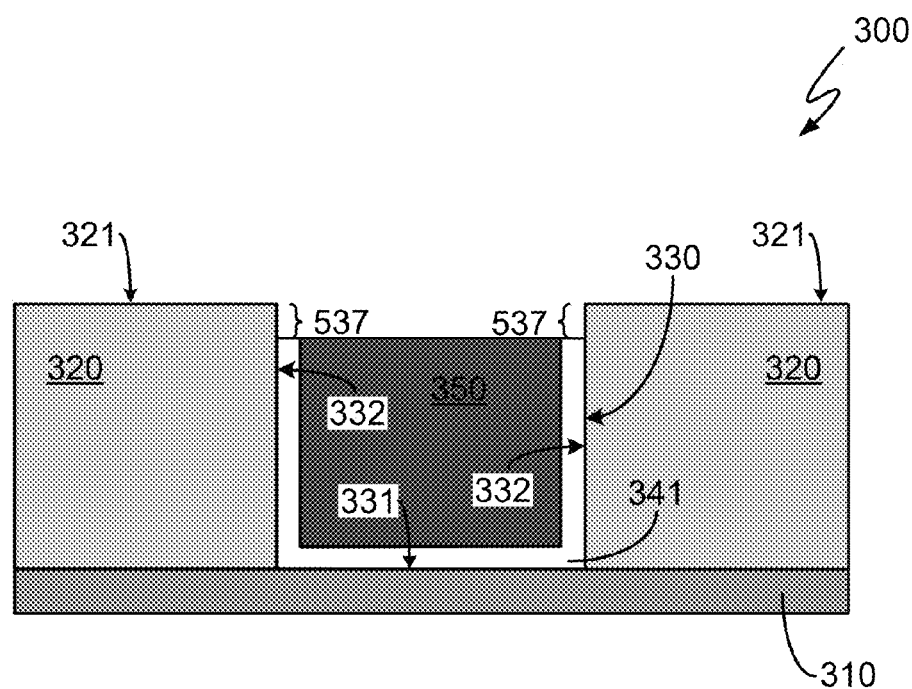

FIG. 5 is a cross-sectional view of structure 300 after the performance of step 220 according to an embodiment of the invention. As illustrated in FIG. 5, portion 435 (see FIG. 4) of metal layer 341 has been etched away from sidewalls 332, leaving a portion 537 of sidewalls 332 exposed above spin-on glass material 350 in excavated feature 330. Significantly, step 220 results in a precisely delineated metal on the vertical side walls of the excavated feature, as required for high performance eDRAM and other devices.

A step 230 of method 200 is to remove the spin-on glass material from the excavated feature by etching it away using a second wet etch chemistry. In one embodiment, the second wet etch chemistry comprises a highly alkaline aqueous chemistry. Appropriate chemistries will be capable of removing the remaining spin-on glass material from the excavated feature without damaging the (now patterned) metal layer or the surrounding electrically insulating layer.

Figure 6:
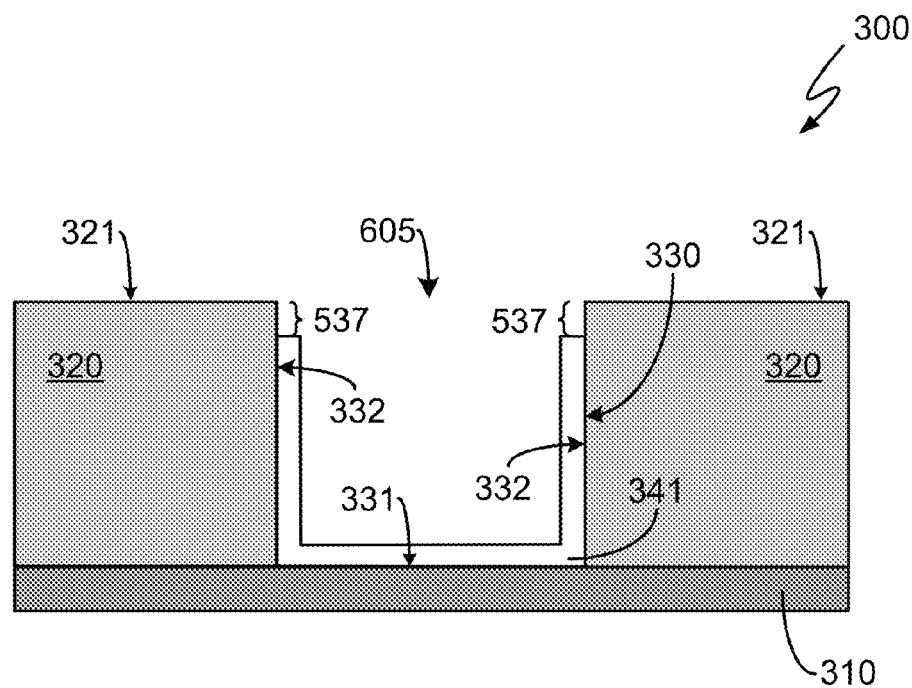

FIG. 6 is a cross-sectional view of structure 300 after the performance of step 230 according to an embodiment of the invention. As illustrated in FIG. 6, spin-on glass material 350 (see FIG. 5) has been removed, leaving an opening 605 in excavated feature 330 interior to metal layer 341. As an example, opening 605 may receive additional layers and materials that act as components of a MIM capacitor in excavated feature 330, as will be discussed in more detail below.

Figure 7:
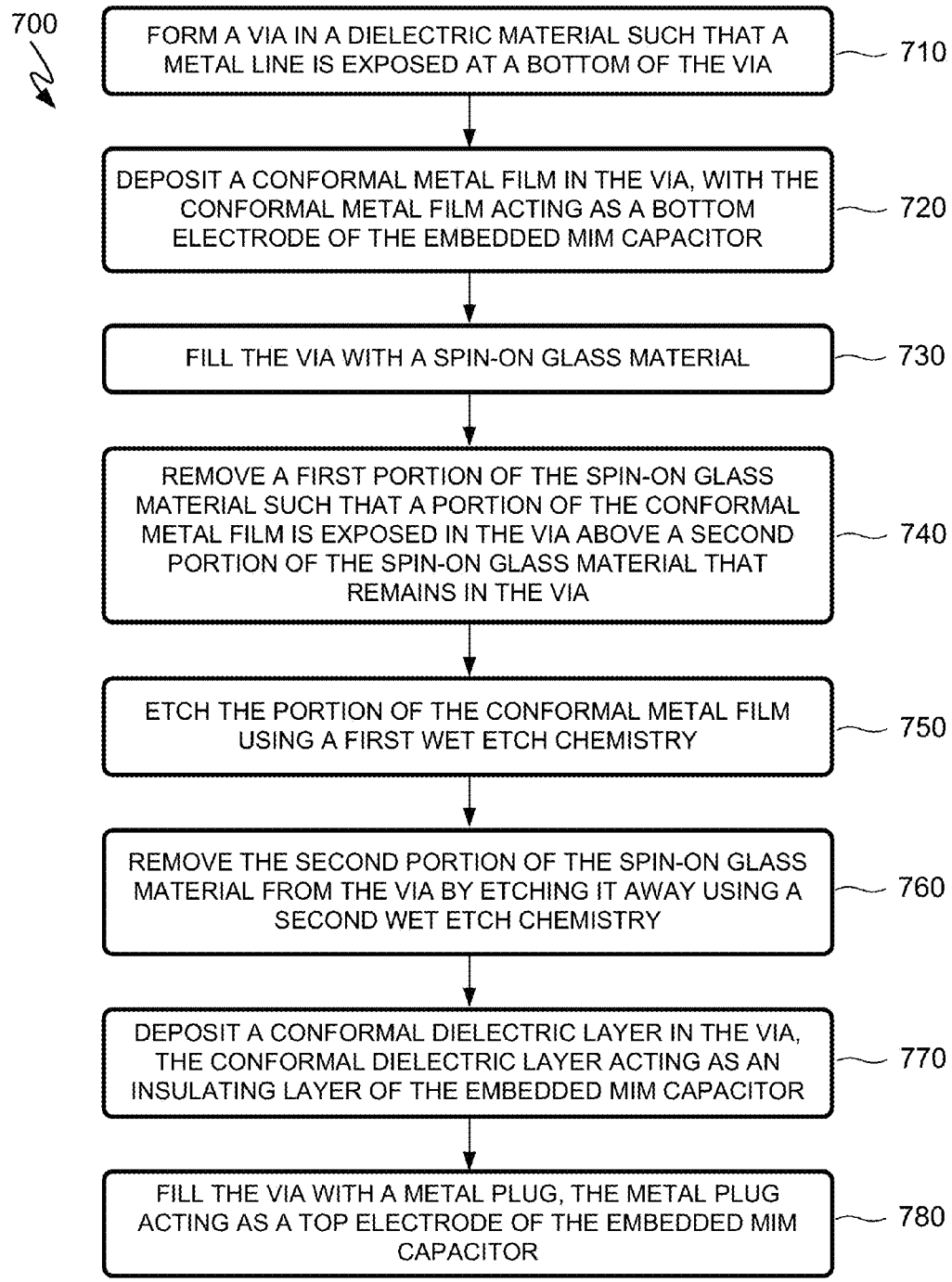
FIG. 7 is a flowchart illustrating a method of forming an embedded MIM capacitor according to an embodiment of the invention.

FIG. 7 is a flowchart illustrating a method 700 of forming an embedded MIM capacitor according to an embodiment of the invention. As an example, method 700 may result in the formation of an embedded MIM capacitor that is similar to embedded memory device 100 that is shown in FIG. 1.

A step 710 of method 700 is to form a via in a dielectric material such that a metal line is exposed at a bottom of the via. As an example, and with reference to FIG. 6, the via can be similar to excavated feature 330 that is formed within electrically insulating layer 320 and the exposed metal line at the bottom of the via can be similar to electrically conductive layer 310. Thus, in one embodiment, the performance of step 710 of method 700 results in a structure like that of FIG. 6 if metal layer 341 were removed. Step 710 can be accomplished using conventional via patterning techniques.

A step 720 of method 700 is to deposit a conformal metal film in the via, with the conformal metal film, or a portion thereof, acting as a bottom electrode of the embedded MIM capacitor. As an example, and with reference to FIG. 3, the conformal metal film can be similar to metal layer 341, which, as may be seen in the figure, has been conformally deposited not only on sidewalls 332 and floor 331 of excavated feature 330 but also on surface 321 of electrically insulating layer 320. Thus, in one embodiment, the performance of step 720 of method 700 results in a structure like that of FIG. 3 if spin-on glass material 350 were removed. As mentioned, and as will be seen below, the conformal metal film (or a portion thereof) will act as the bottom electrode of the embedded MIM capacitor that may be constructed using method 700. In one embodiment, step 720 may comprise the deposition of tantalum (Ta) tantalum nitride (TaN), titanium (Ti), titanium nitride (TiN) or the like using CVD, atomic layer deposition (ALD), or similar techniques.

A step 730 of method 700 is to fill the via with a spin-on glass material. As an example, the spin-on glass material can be similar to spin-on glass material 350 that is first shown in FIG. 3. As another example, the performance of step 730 of method 700 may result in a structure like that shown in FIG. 3. In various embodiments, step 730 comprises depositing the spin-on glass material using a CVD technique, a spin-coating technique, or another suitable deposition technique.

A step 740 of method 700 is to remove a first portion of the spin-on glass material such that a portion of the conformal metal film is exposed in the via above a second portion of the spin-on glass material that remains in the via. (A portion of the conformal metal film is also exposed above the surface of the electrically insulating material.) As mentioned above, the remaining spin-on glass material in the via will act as a mask for wet chemical etching. In one embodiment, step 740 is accomplished using a plasma etch or the like. As an example, the performance of step 740 of method 700 may result in a structure like that shown in FIG. 4.

A step 750 of method 700 is to etch the portion of the conformal metal film (i.e., the portion that is exposed above the portion of the spin-on glass material that remains in the via) using a first wet etch chemistry. The remaining portion of the conformal metal film will act as the bottom electrode of the MIM capacitor. As an example, the performance of step 750 of method 700 may result in a structure like that shown in FIG. 5. In one embodiment, the first wet etch chemistry comprises an oxidizing or acid-based aqueous chemistry. In the same or another embodiment, step 750 could be combined with step 760 (see below) in a single wet etch recipe and process tool. More specifically, steps 750 and 760 can be done with a single recipe on a batch or single wafer cleaning tool equipped with the chemistries needed for both metal etch and spin-on glass material removal.

A step 760 of method 700 is to remove the second portion of the spin-on glass material from the via by etching it away using a second wet etch chemistry. As an example, the performance of step 760 of method 700 may result in a structure like that shown in FIG. 6. In one embodiment, the second wet etch chemistry comprises a highly alkaline aqueous chemistry.

A step 770 of method 700 is to deposit a conformal dielectric layer in the via, the conformal dielectric layer acting as an insulating layer of the embedded MIM capacitor. As an example, the conformal dielectric layer can be similar to a conformal dielectric layer 842 that is first shown in FIG. 8, which is a cross-sectional view of an embedded MIM capacitor 800 at a particular point in its manufacturing process according to an embodiment of the invention. As another example, conformal dielectric layer 842 can be similar to electrically insulating layer 142 that is shown in FIG. 1. In one embodiment, step 770 is accomplished using ALD or CVD techniques, or the like. As mentioned, and as will be seen below, the conformal dielectric layer will act as the insulating layer of the embedded MIM capacitor that may be constructed using method 700.

Figure 8:
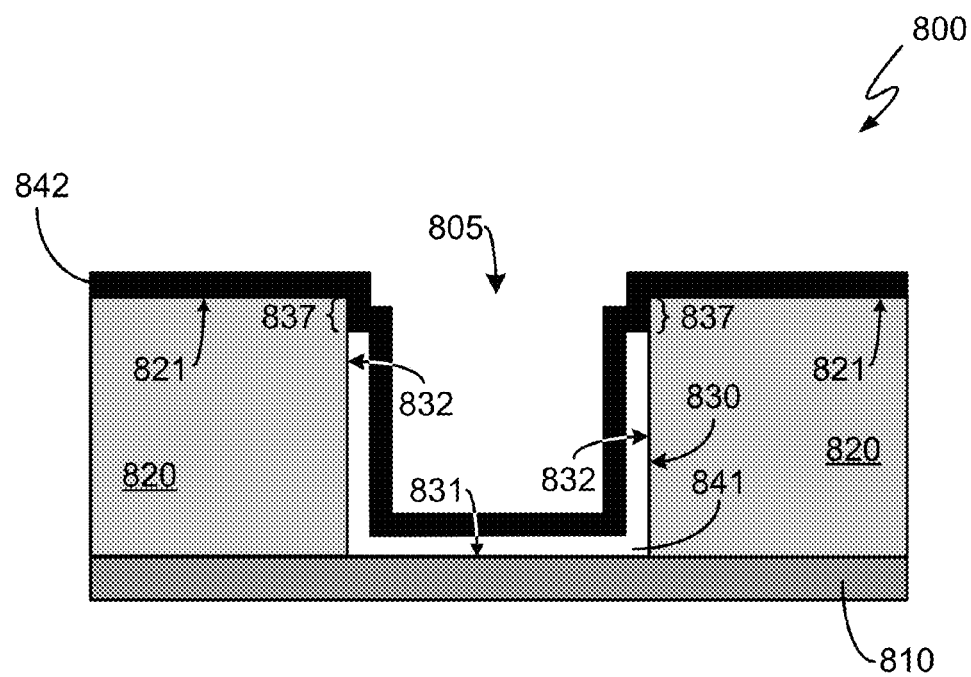
FIGS. 8 and 9 are cross-sectional views of an embedded MIM capacitor at different particular points in a manufacturing process according to an embodiment of the invention.

As illustrated in FIG. 8, embedded MIM capacitor 800 comprises, in addition to conformal dielectric layer 842, an electrically conductive layer 810, an electrically insulating layer 820 over electrically conductive layer 810, and a via 830 in electrically insulating layer 820 that extends to electrically conductive layer 810. Electrically conductive layer 810 acts as a floor 831 of via 830. Via 830 further comprises sidewalls 832 extending away from floor 831, as shown. A metal layer 841 lines via 830 and covers a surface 821 of electrically insulating layer 820. As an example, electrically conductive layer 810, electrically insulating layer 820, via 830, floor 831, sidewalls 832, and metal layer 841 can be similar to, respectively, electrically conductive layer 110, electrically insulating layer 120, excavated feature 130, floor 131, sidewalls 132, and electrically conductive layer 141, all of which are shown in FIG. 1.

FIG. 8 further illustrates an opening 805 in via 830 that can be similar to opening 605 that is shown in FIG. 6. It should be noted that following the performance of step 780, portion 837 of sidewalls 832, as well as surface 821 of electrically insulating material 820, are covered by conformal dielectric layer 842 in a way that is similar to the way electrically insulating layer 142 covers portion 137 of sidewalls 132, as illustrated in FIG. 1.

Figure 9:
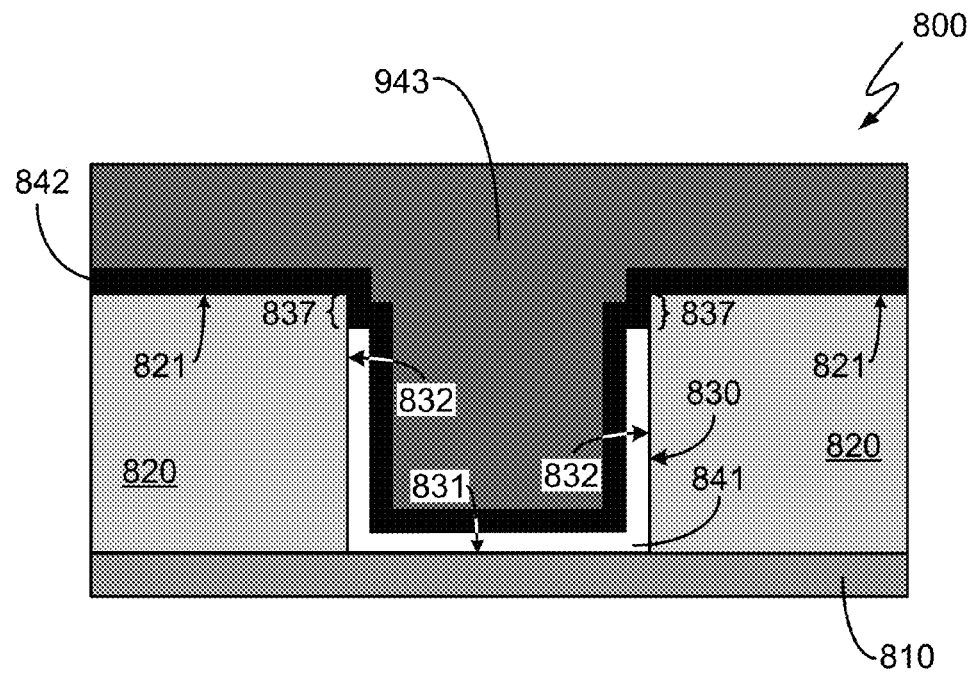

A step 780 of method 700 is to fill the via with a metal plug, the metal plug acting as a top electrode of the embedded MIM capacitor. As an example, the metal plug can be similar to a metal plug 943 that is first shown in FIG. 9, which is a cross-sectional view of embedded MIM capacitor 800 at a different particular point in its manufacturing process according to an embodiment of the invention. As another example, the metal plug can be similar to electrically conductive layer 143 that is shown in FIG. 1. As mentioned, and as will be seen below, the metal plug will act as the top electrode of the embedded MIM capacitor that may be constructed using method 700.

In one embodiment, step 780 comprises electroplating a layer of copper over conformal dielectric layer 842 in order to fill opening 805 (see FIG. 8). In the illustrated embodiment the electroplating step completely fills via 830 and also covers the sections of conformal dielectric layer 842 that are over surface 821 with a layer of electroplated copper. Once the portions of metal plug 943 and conformal dielectric layer 842 that overlie surface 821 are removed, as with a chemical mechanical polish (CMP) or other planarizing step, embedded MIM capacitor 800 is complete and has an appearance similar to that of embedded memory device of FIG. 1.

Although the invention has been described with reference to specific embodiments, it will be understood by those skilled in the art that various changes may be made without departing from the spirit or scope of the invention. Accordingly, the disclosure of embodiments of the invention is intended to be illustrative of the scope of the invention and is not intended to be limiting. It is intended that the scope of the invention shall be limited only to the extent required by the appended claims. For example, to one of ordinary skill in the art, it will be readily apparent that the embedded memory device and the related structures and methods discussed herein may be implemented in a variety of embodiments, and that the foregoing discussion of certain of these embodiments does not necessarily represent a complete description of all possible embodiments.

Additionally, benefits, other advantages, and solutions to problems have been described with regard to specific embodiments. The benefits, advantages, solutions to problems, and any element or elements that may cause any benefit, advantage, or solution to occur or become more pronounced, however, are not to be construed as critical, required, or essential features or elements of any or all of the claims.

Moreover, embodiments and limitations disclosed herein are not dedicated to the public under the doctrine of dedication if the embodiments and/or limitations: (1) are not expressly claimed in the claims; and (2) are or are potentially equivalents of express elements and/or limitations in the claims under the doctrine of equivalents.

What is claimed is:

1. An embedded memory device comprising:
a first electrically conductive layer formed from a first metal;
a first electrically insulating layer over the first electrically conductive layer;
an excavated feature in the first electrically insulating layer that extends through the first electrically insulating layer to the first electrically conductive layer, the first electrically conductive layer extending under all of the excavated feature; and
a MIM capacitor in the excavated feature, the MIM capacitor comprising:
a second electrically conductive layer located in the excavated feature adjacent to and electrically connected to the first electrically conductive layer;
a second electrically insulating layer located in the excavated feature interior to the second electrically conductive layer; and
a third electrically conductive layer located in the excavated feature interior to the second electrically insulating layer,
wherein:
the first electrically conductive layer acts as a floor of the excavated feature and the excavated feature further comprises sidewalls extending away from the floor;
the second electrically conductive layer covers the floor and a first portion of the sidewalls;
the second electrically insulating layer covers the second electrically conductive layer and a second portion of the sidewalls; and
the third electrically conductive layer is formed from the first metal.

2. The embedded memory device of claim 1 wherein:
the first metal is copper.

3. The embedded memory device of claim 1 wherein:
the second electrically insulating layer is a conformal dielectric film.

4. The embedded memory device of claim 3 wherein:
the conformal dielectric film comprises a high-k material.

5. The embedded memory device of claim 1 wherein:
an angle between at least one of the sidewalls of the excavated feature and the floor of the excavated feature has a magnitude between approximately 60 and 80 degrees.

6. The embedded memory device of claim 1 wherein:
an angle between at least one of the sidewalls of the excavated feature and the floor of the excavated feature has a magnitude of approximately 100 degrees.

* * * * *